United States Patent
Yoshida

(10) Patent No.: US 10,672,761 B2
(45) Date of Patent: Jun. 2, 2020

(54) SEMICONDUCTOR DEVICE

(71) Applicant: Mitsubishi Electric Corporation, Tokyo (JP)

(72) Inventor: Takuya Yoshida, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/151,853

(22) Filed: Oct. 4, 2018

(65) Prior Publication Data

US 2019/0319026 A1 Oct. 17, 2019

(30) Foreign Application Priority Data

Apr. 17, 2018 (JP) .................. 2018-079227

(51) Int. Cl.
*H01L 27/06* (2006.01)
*H01L 29/06* (2006.01)
*H01L 29/10* (2006.01)
*H01L 29/739* (2006.01)
*H01L 29/861* (2006.01)
*H01L 29/16* (2006.01)
*H01L 29/20* (2006.01)

(52) U.S. Cl.
CPC ...... *H01L 27/0664* (2013.01); *H01L 29/0623* (2013.01); *H01L 29/1095* (2013.01); *H01L 29/7397* (2013.01); *H01L 29/8613* (2013.01); *H01L 29/16* (2013.01); *H01L 29/1602* (2013.01); *H01L 29/1608* (2013.01); *H01L 29/2003* (2013.01)

(58) Field of Classification Search
None
See application file for complete search history.

(56) References Cited

U.S. PATENT DOCUMENTS 8,168,999 B2 * 5/2012 Tsuzuki ............... H01L 29/167
257/143
2009/0242931 A1 10/2009 Tsuzuki et al.
2015/0014741 A1 * 1/2015 Chen .................. H01L 29/7397
257/139

FOREIGN PATENT DOCUMENTS

JP 2009-267394 A 11/2009

* cited by examiner

*Primary Examiner* — Robert K Carpenter
(74) *Attorney, Agent, or Firm* — Studebaker & Brackett PC

(57) ABSTRACT

A semiconductor device includes: a semiconductor substrate having a cell region, a termination region located around the cell region, and a wiring region; an IGBT provided in the cell region; an insulating film provided on the semiconductor substrate in the wiring region; a gate electrode provided on the insulating film and connected to a gate of the IGBT; a p-type well layer provided on a surface side of the semiconductor substrate in the termination region; and a diode provided in the wiring region, wherein the diode includes a the p-type base layer provided on the surface side of the semiconductor substrate and an n-type cathode layer provided on a reverse side of the semiconductor substrate, the p-type base layer is provided in common to the wiring region and the cell region and has a lower impurity concentration and a smaller depth than the p-type well layer.

12 Claims, 5 Drawing Sheets

SEMICONDUCTOR DEVICE

BACKGROUND OF THE INVENTION

Field

The present invention relates to a semiconductor device including a transistor and a free-wheeling diode and having reverse conducting characteristic.

Background

Power semiconductor devices such as insulated gate bipolar transistors (IGBTs), power MOSFETs or diodes are required to reduce power loss, which is the sum of steady loss in a conduction state and switching loss in a switching state. In response to this, the design of device structure is optimized to meet the demand from the market. These power semiconductor devices are generally often used as inverter apparatuses which combine a plurality of pairs of switching elements and free-wheeling diodes connected inversely parallel thereto.

A reverse conducting insulated gate bipolar transistor (hereinafter described as "RC-IGBT") is obtained by integrating functions of an IGBT and a free-wheeling diode into one semiconductor substrate, that is, forming those functions in one chip. Compared to an inverter circuit combining a normal IGBT chip and a free-wheeling diode chip individually, forming an inverter circuit using the RC-IGBT makes it possible to reduce the number of chips by half and achieve a size reduction and a cost reduction. Development of RC-IGBTs has been pursued for the purpose of a size reduction and a cost reduction in addition to such a reduction of power loss in this way.

An IGBT and a free-wheeling diode in an RC-IGBT are provided in a cell region that operates so that a current flows in a longitudinal direction of a semiconductor substrate by applying a voltage to electrodes on the front and reverse sides of a semiconductor substrate. A termination region for retaining a withstand voltage is positioned in an outer circumferential part of the cell region. A wiring region is positioned between the cell region and the termination region or between the cell regions. A gate pad for wire-bonding and a gate wiring for electrically connecting the gate pad and the gate of the IGBT cell in the cell region are provided in the wiring region. A diffusion layer having a high impurity concentration and a large depth is provided in the termination region and the wiring region, and electric fields applied to these regions are relaxed when a reverse bias is applied to the semiconductor device. The termination region and the wiring region are ineffective regions. In the ineffective regions, a pnp or npn bipolar transistor is configured and no current flows when a forward bias is applied thereto. The ineffective regions are intentionally not allowed to operate as the semiconductor device.

Since the ineffective region is large as shown above, and it is necessary to expand the cell region and increase the size of the semiconductor device to achieve desired performance. In contrast, a structure is proposed in which an n-type cathode layer is formed on the reverse side of the substrate in the wiring region and intentionally caused to operate as a diode, and the effective region is thereby expanded (e.g., see JP 2009-267394A). This makes it possible to improve diode performance.

SUMMARY

However, a $p^+$-type well layer having a high impurity concentration and a large depth is formed as an anode layer in the wiring region in the same way as in the termination region. This results in a problem that a recovery current increases. In order to prevent this, it may be possible to partially irradiate the wiring region with an electron beam or helium beam to control a life time or form a low-concentration anode layer in the wiring region in another step, which, however, increases manufacturing steps. Furthermore, if the impurity concentration of the p layer of the substrate surface is lowered and the depth thereof is reduced in the wiring region and the termination region, there is concern that the withstand voltage may drop and destruction or the like may occur during abrupt switching operation.

The present invention has been implemented to solve the above-described problems, and it is an object of the present invention to provide a semiconductor device capable of inhibiting an increase in recovery current and realizing a high withstand voltage and a high breakdown voltage without increasing manufacturing steps.

A semiconductor device according to the present invention includes: a semiconductor substrate having a cell region, a termination region located around the cell region, and a wiring region; an IGBT provided in the cell region; an insulating film provided on the semiconductor substrate in the wiring region; a gate electrode provided on the insulating film and connected to a gate of the IGBT; a p-type well layer provided on a surface side of the semiconductor substrate in the termination region; and a diode provided in the wiring region, wherein the diode includes a the p-type base layer provided on the surface side of the semiconductor substrate and an n-type cathode layer provided on a reverse side of the semiconductor substrate, the p-type base layer is provided in common to the wiring region and the cell region and has a lower impurity concentration and a smaller depth than the p-type well layer.

In the present invention, the p-type base layer of the diode provided in the wiring region has a lower impurity concentration and a smaller depth than the p-type well layer in the termination region. This makes it possible to reduce the amount of holes supplied and inhibit an increase in recovery current. The p-type base layer of the diode is provided in common to the wiring region and the cell region, which does not increase manufacturing steps to form the diode. By forming the p-type well layer having a high impurity concentration and a large depth in the termination region, it is possible to inhibit concentration of electric field on the termination region and achieve a high withstand voltage and a high breakdown voltage.

Other and further objects, features and advantages of the invention will appear more fully from the following description.

DESCRIPTION OF EMBODIMENTS

A semiconductor device according to the embodiments of the present invention will be described with reference to the drawings. The same components will be denoted by the same symbols, and the repeated description thereof may be omitted.

First Embodiment

Figure 1:
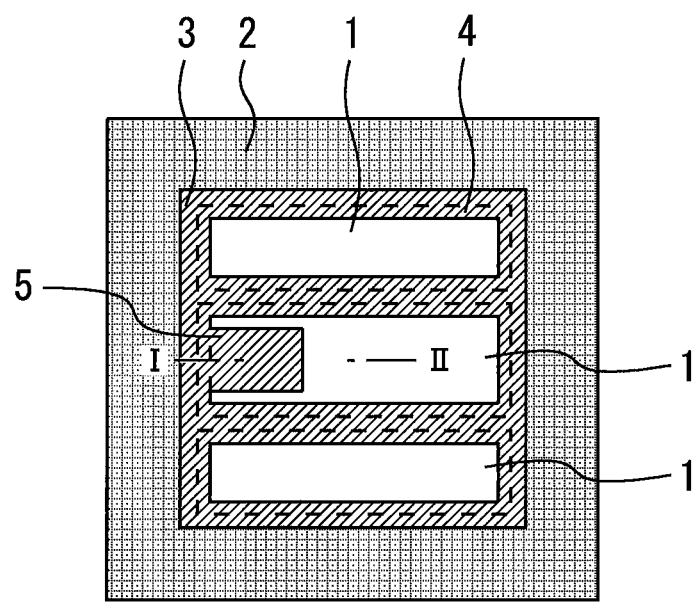
FIG. 1 is a top view illustrating a region of a semiconductor device according to a first embodiment.

FIG. 1 is a top view illustrating a region of a semiconductor device according to a first embodiment. A termination region 2 for retaining a withstand voltage is located around a cell region 1 of an RC-IGBT. A wiring region 3 is positioned between the cell region 1 and the termination region 2 or between the cell regions 1. A gate wiring 4 and a gate pad 5 are provided in this wiring region 3. The region including the cell region 1 enclosed by the wiring region 3 is called an "active region" to distinguish it from the termination region 2.

Figure 2:
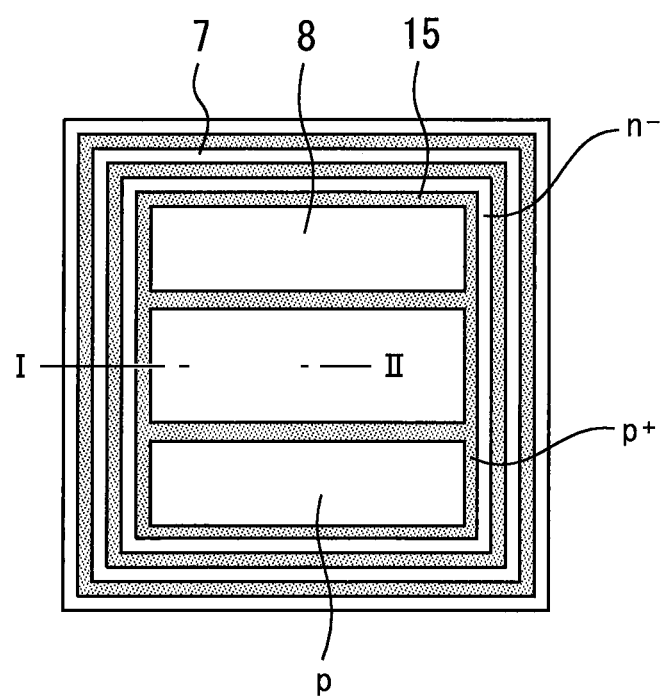
FIG. 2 is a top view illustrating the semiconductor substrate according to the first embodiment.
Figure 3:
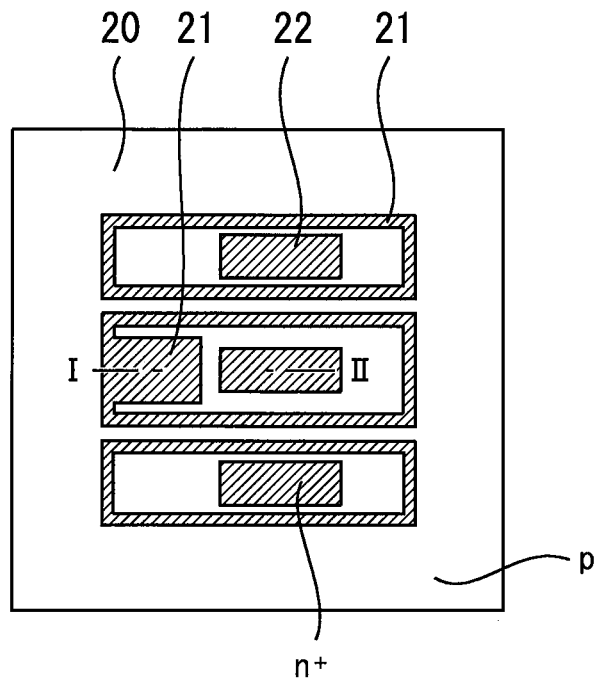
FIG. 3 is a bottom view illustrating the semiconductor substrate according to the first embodiment.
Figure 4:
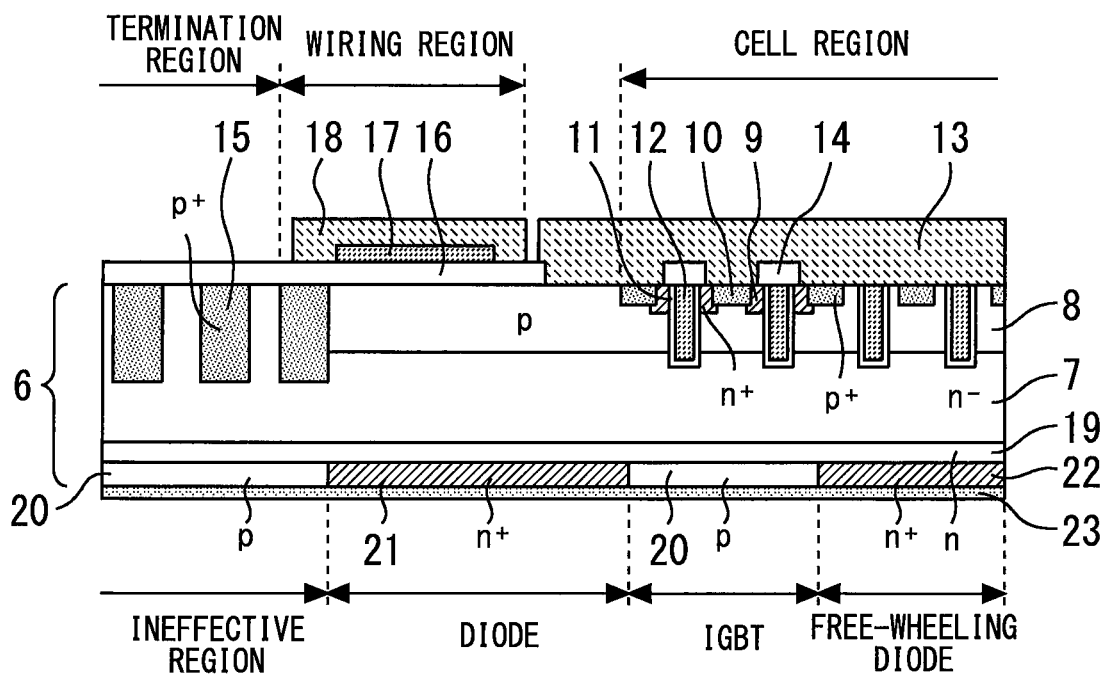
FIG. 4 is a cross-sectional view illustrating the semiconductor device according to the first embodiment.

FIG. 2 is a top view illustrating the semiconductor substrate according to the first embodiment. FIG. 3 is a bottom view illustrating the semiconductor substrate according to the first embodiment. FIG. 4 is a cross-sectional view illustrating the semiconductor device according to the first embodiment and corresponds to cross-sectional views along I-II in FIGS. 1 to 3. An IGBT and a free-wheeling diode are provided in the cell region.

An $n^-$-type drift layer 7 of a semiconductor substrate 6 is common to all the regions. A p-type base layer 8 is provided on the $n^-$-type drift layer 7 of the semiconductor substrate 6 in the cell region and the wiring region. In the IGBT, an $n^+$-type emitter layer 9 and a $p^+$-type emitter layer 10 are provided on the surface side of the p-type base layer 8. A trench gate 12 made of polysilicon is provided in a trench that penetrates the $n^+$-type emitter layer 9 via a gate oxide film 11. In the free-wheeling diode, a $p^+$-type emitter layer 10 is provided on the surface side of the p-type base layer 8. Furthermore, the free-wheeling diode is also provided with a trench to retain a withstand voltage, but the free-wheeling diode is electrically separated from the trench gate 12 so as not to function as a gate. A surface electrode 13 is connected to the p-type base layer 8, the $n^+$-type emitter layer 9 and the $p^+$-type emitter layer 10. $n^+$-type emitter layer The trench gate 12 and the surface electrode 13 are electrically separated from each other by an inter-layer insulating film 14.

Note that the p-type base layer 8 and the $p^+$-type emitter layer 10 of the free-wheeling diode function as an anode electrode of the diode. The p-type base layer 8 and the $p^+$-type emitter layer 10 of the free-wheeling diode and the IGBT are formed simultaneously so that they are manufactured at low cost. However, the free-wheeling diode and the IGBT may also be formed individually focusing on the aspect of performance.

A plurality of $p^+$-type well layers 15 are partially provided on the surface side of the semiconductor substrate 6 in the termination region. As shown in FIG. 2, a plurality of $p^+$-type well layers 15 surround the p-type base layer 8 in the cell region and the wiring region on the surface side of the semiconductor substrate 6. The innermost $p^+$-type well layer 15 is in contact with the p-type base layer 8. By setting both the $p^+$-type well layer 15 and the p-type base layer 8 at the same potential, it is possible to relax concentration of an electric field applied to the termination side of the cell region or the wiring region.

An insulating film 16 is provided on the semiconductor substrate 6 in the wiring region and the termination region. Gate electrodes 17 and 18 connected to the gate of the IGBT are provided on the insulating film 16. The $p^+$-type well layer 15 is electrically separated from the gate electrodes 17 and 18 by the insulating film 16. The gate electrodes 17 and 18 correspond to the gate wiring 4 or the gate pad 5 in FIG. 1.

An n-type buffer layer 19 is provided below the $n^-$-type drift layer 7 in common to all the regions. A p-type collector layer 20 is provided below the n-type buffer layer 19 in the IGBT and the termination region. An $n^+$-type cathode layer 21 is provided below the n-type buffer layer 19 in the free-wheeling diode and the wiring region. A reverse-side electrode 23 is provided below the p-type collector layer 20 and the $n^+$-type cathode layer 21 in common to all the regions.

A diode is constructed of the p-type base layer 8 provided on the surface side of the semiconductor substrate 6 in the wiring region and the $n^+$-type cathode layer 21 provided on the reverse side of the semiconductor substrate 6. The p-type base layer 8 has a lower impurity concentration and a smaller depth than the $p^+$-type well layer 15. The p-type collector layer 20 is provided on the reverse side of the semiconductor substrate 6 in the termination region to construct a pnp bipolar transistor, thus forming a structure intentionally preventing any current from flowing.

Figure 5:
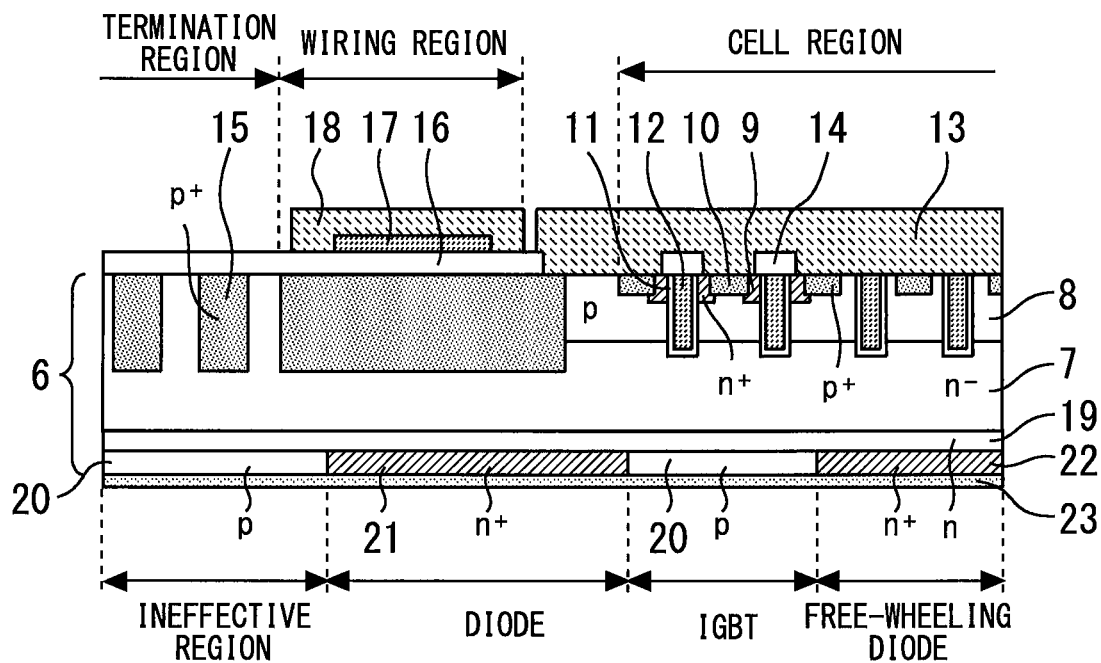
FIG. 5 is a cross-sectional view illustrating a semiconductor device according to a comparative example.

Next, effects of the present embodiment will be described in comparison with comparative examples. FIG. 5 is a cross-sectional view illustrating a semiconductor device according to a comparative example. In the comparative example, the $p^+$-type well layer 15 having a high impurity concentration and a large depth is formed as the anode layer in the wiring region in the same way as in the termination region. This causes a recovery current to increase. In contrast, according to the present embodiment, the p-type base layer 8 of the diode provided in the wiring region has a lower impurity concentration and a smaller depth than the $p^+$-type well layer 15 in the termination region. This makes it possible to reduce the amount of holes supplied and inhibit an increase in recovery current.

In the present embodiment, the p-type base layer 8 of the diode is provided in common to the wiring region and the cell region, which does not increase manufacturing steps to form the diode. By forming the $p^+$-type well layer 15 having a high impurity concentration and a large depth in the termination region, it is possible to inhibit concentration of electric field on the termination region and achieve a high withstand voltage and a high breakdown voltage.

Second Embodiment

Figure 6:
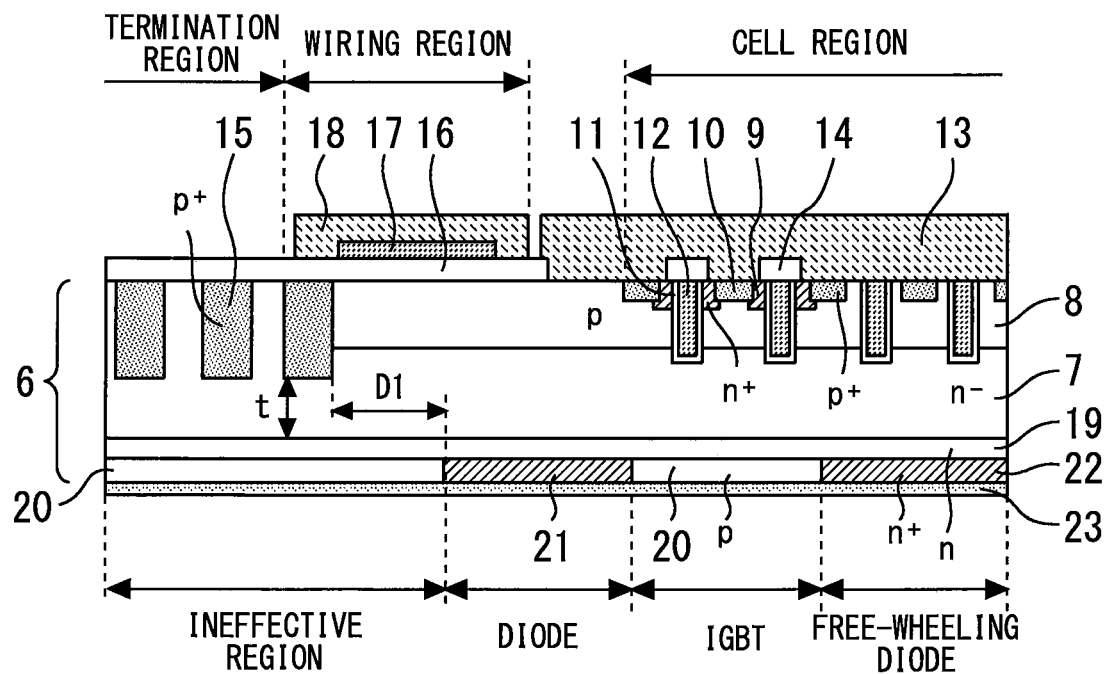
FIG. 6 is a cross-sectional view illustrating a semiconductor device according to a second embodiment.

FIG. 6 is a cross-sectional view illustrating a semiconductor device according to a second embodiment. In the present embodiment, a distance D1 from the $p^+$-type well layer 15 having a high impurity concentration and a large depth to the $n^+$-type cathode layer 21 is set to be equal to or greater than a thickness t of the $n^-$-type drift layer 7 right below the $p^+$-type well layer 15. Thus, making the distance D1 from the $p^+$-type well layer 15 to the $n^+$-type cathode layer 21 wider can inhibit the supply of holes from the $n^+$-type cathode layer 21 and reduce recovery current. When an angle at which holes spread from the $p^+$-type well layer 15 on the surface side toward the $n^+$-type cathode layer 21 on the reverse side is assumed to be 45°, the distance D1 should be equal to or greater than the thickness t of the $n^-$-type drift layer 7 to inhibit the supply of holes from the $n^+$-type cathode layer 21.

Third Embodiment

Figure 7:
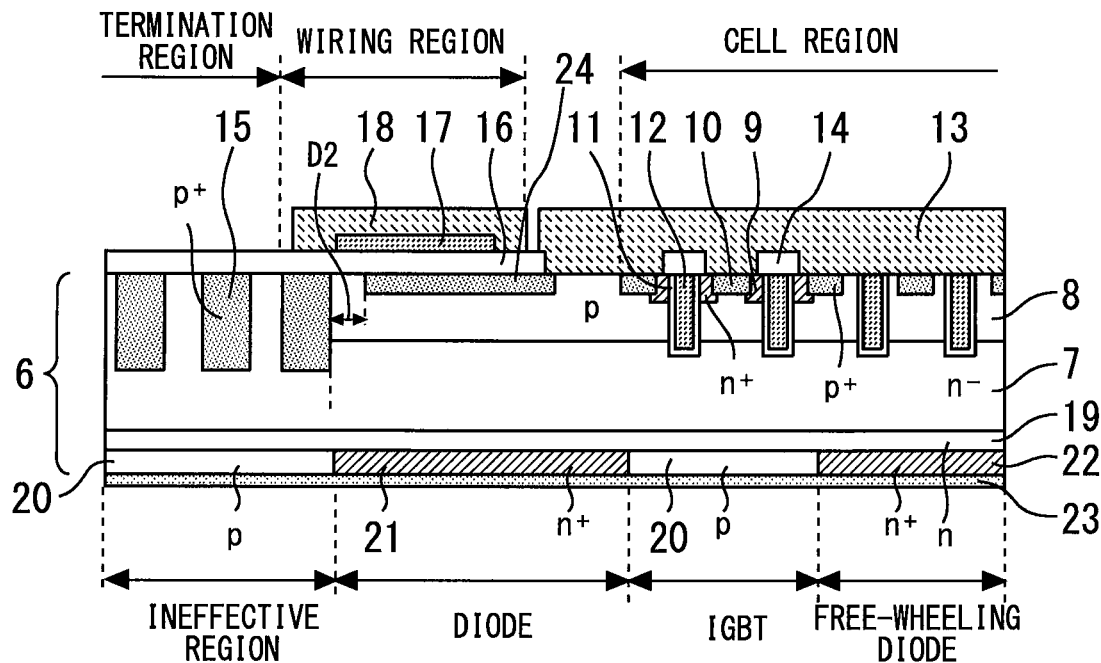
FIG. 7 is a cross-sectional view illustrating a semiconductor device according to a third embodiment.

FIG. 7 is a cross-sectional view illustrating a semiconductor device according to a third embodiment. According to the present embodiment, a $p^+$-type emitter layer 24 having a higher impurity concentration than the p-type base layer 8 is provided on the surface side of the p-type base layer 8 in the wiring region. This makes it possible to reduce resistance of contact with the surface electrode 13 and reduce forward direction loss. When a barrier metal such as Ti, TiN or TiW is formed on the surface electrode 13 in particular, good ohmic contact with the barrier metal can be obtained by increasing impurity concentration on a joint surface.

Furthermore, the $p^+$-type emitter layer 24 is away from the $p^+$-type well layer 15 by a distance D2 and the p-type base layer 8 having a relatively low impurity concentration is provided between both layers to prevent their connection. It is thereby possible to inhibit the supply of holes from the $p^+$-type well layer 15 and inhibit an increase in recovery current.

Furthermore, the $p^+$-type emitter layer 24 in the wiring region has the same impurity concentration and the same depth as those of the $p^+$-type emitter layer 10 of the IGBT and the free-wheeling diode. Therefore, the $p^+$-type emitter layer 24 can be formed simultaneously with the $p^+$-type emitter layer 10, which eliminates the need for any new manufacturing step.

Fourth Embodiment

Figure 8:
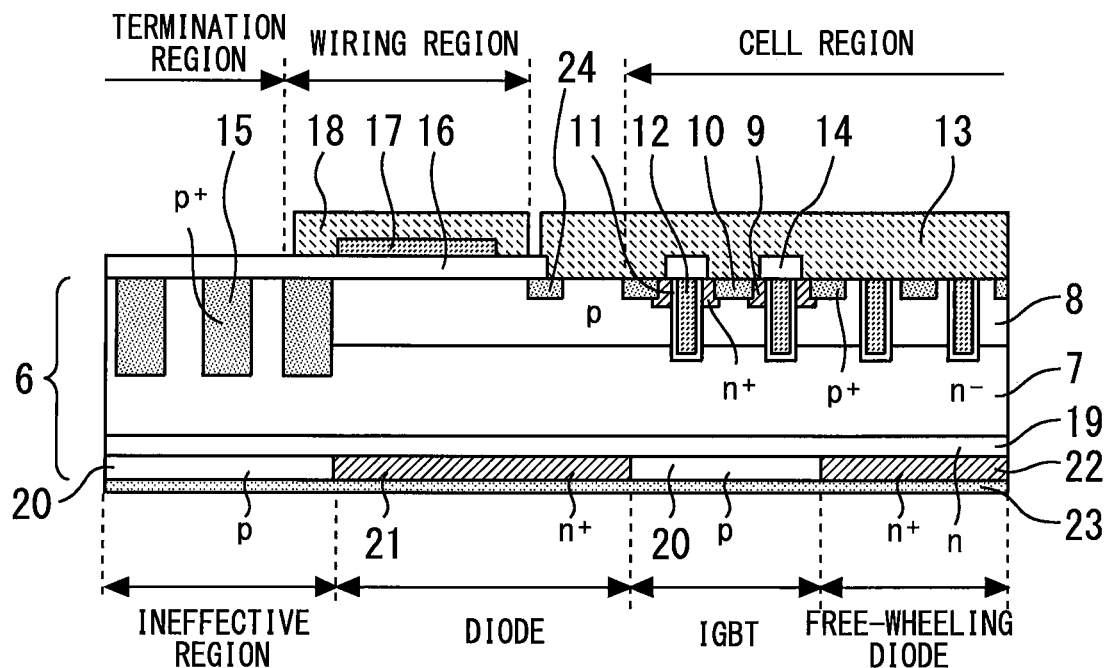
FIG. 8 is a cross-sectional view illustrating a semiconductor device according to a fourth embodiment.

FIG. 8 is a cross-sectional view illustrating a semiconductor device according to a fourth embodiment. According to the present embodiment, the $p^+$-type emitter layer 24 is locally provided in a part of the wiring region connected to the surface electrode 13 and is not provided below the gate wiring 4. By forming the $p^+$-type emitter layer 24 only in the part connected to the surface electrode 13, it is possible to reduce the volume of the $p^+$-type emitter layer 24 having a high impurity concentration and reduce recovery current while maintaining good performance of ohmic contact with the surface electrode 13.

Fifth Embodiment

Figure 9:
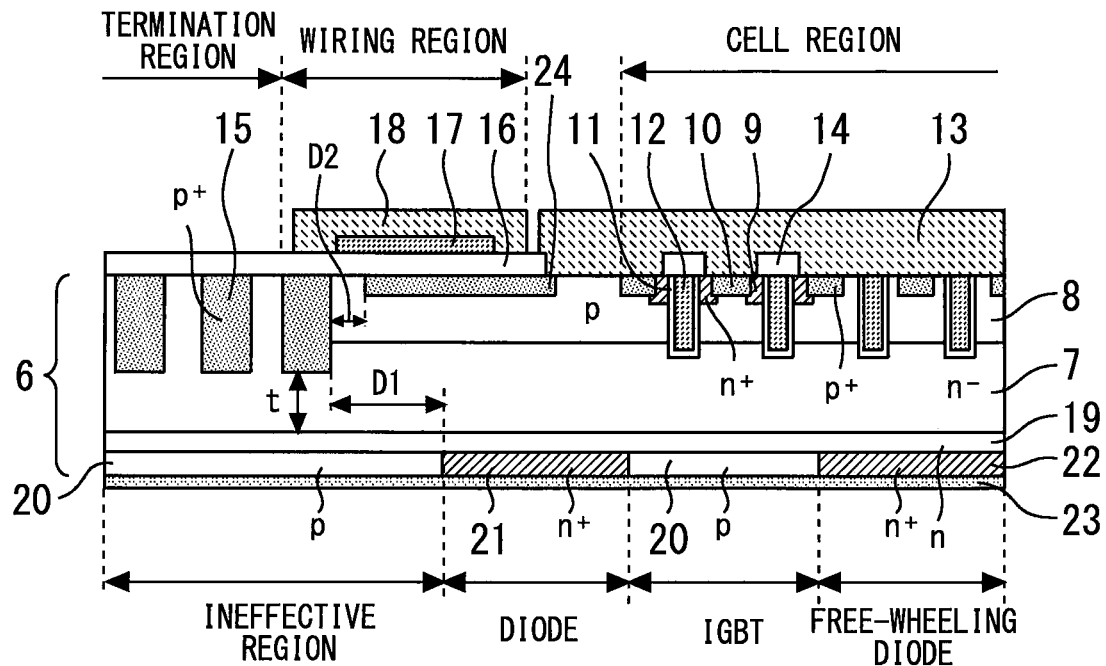
FIG. 9 is a cross-sectional view illustrating a semiconductor device according to a fifth embodiment.

FIG. 9 is a cross-sectional view illustrating a semiconductor device according to a fifth embodiment. According to the present embodiment, the distance D1 from the $p^+$-type well layer 15 to the $n^+$-type cathode layer 21 is set to be equal to or greater than the thickness t of the $n^-$-type drift layer 7. Furthermore, the $p^+$-type emitter layer 24 having a higher impurity concentration than the p-type base layer 8 is provided on the surface side of the p-type base layer 8 in the wiring region. The effects of the second and third embodiments can be obtained in this way.

Sixth Embodiment

Figure 10:
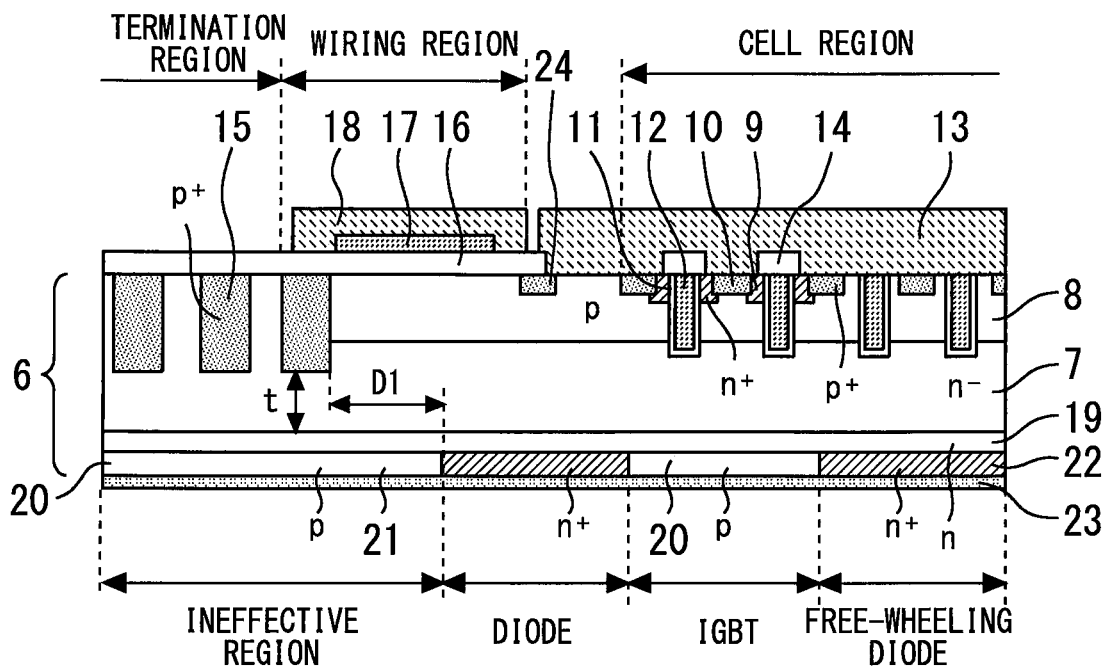
FIG. 10 is a cross-sectional view illustrating a semiconductor device according to a sixth embodiment.

FIG. 10 is a cross-sectional view illustrating a semiconductor device according to a sixth embodiment. According to the present embodiment, the distance D1 from the $p^+$-type well layer 15 to the $n^+$-type cathode layer 21 is set to be equal to or greater than the thickness t of the $n^-$-type drift layer 7. Furthermore, the $p^+$-type emitter layer 24 is locally provided in a part of the wiring region connected to the surface electrode 13 and is not provided below the gate wiring 4. The effects of the second and fourth embodiments can be obtained in this way.

The semiconductor substrate 6 is not limited to a substrate formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2018-079227, filed on Apr. 17, 2018 including specification, claims, drawings and summary, on which the Convention priority of the present application is based, is incorporated herein by reference in its entirety.

The invention claimed is:

1. A semiconductor device comprising:
    a semiconductor substrate having a cell region, a termination region located around the cell region, and a wiring region;
    an IGBT provided in the cell region;
    an insulating film provided on the semiconductor substrate in the wiring region;
    a gate electrode provided on the insulating film and connected to a gate of the IGBT;
    a p-type base layer provided on a surface side of the semiconductor substrate in the cell region and the wiring region;
    a p-type well layer provided on a surface side of the semiconductor substrate in the termination region; and
    a diode provided in the wiring region, wherein
    the diode includes the p-type base layer and an n-type cathode layer provided on a reverse side of the semiconductor substrate,
    an impurity concentration of the p-type base layer in the cell region is equal to an impurity concentration of the p-type base layer in the wiring region,
    a depth of the p-type base layer in the cell region is equal to a depth of the p-type base layer in the wiring region, and
    the p-type base layer has a lower impurity concentration and a smaller depth than the p-type well layer.

2. The semiconductor device according to claim 1, further comprising:

a p-type emitter layer provided on a surface side of the p-type base layer in the wiring region and having a higher impurity concentration than the p-type base layer; and a surface electrode connected to the p-type base layer and the p-type emitter layer, wherein the p-type emitter layer is away from the p-type well layer.

3. The semiconductor device according to claim 2, wherein the p-type emitter layer is provided in a part connected to the surface electrode.

4. The semiconductor device according to claim 1, wherein the semiconductor substrate is made of a wide-band-gap semiconductor.

5. The semiconductor device according to claim 2, wherein the semiconductor substrate is made of a wide-band-gap semiconductor.

6. The semiconductor device according to claim 3, wherein the semiconductor substrate is made of a wide-band-gap semiconductor.

7. A semiconductor device comprising:

a semiconductor substrate having a cell region, a termination region located around the cell region, and a wiring region;

an IGBT provided in the cell region;

an insulating film provided on the semiconductor substrate in the wiring region;

a gate electrode provided on the insulating film and connected to a gate of the IGBT;

a p-type well layer provided on a surface side of the semiconductor substrate in the termination region; and a diode provided in the wiring region;

an n-type drift layer provided in the semiconductor substrate between the p-type base layer and the n-type cathode layer, wherein the p-type well layer is in the wiring region, a distance as seen in a plan view from the p-type well layer to the n-type cathode layer is equal to or greater than a thickness of the n-type drift layer, the diode includes a the p-type base layer provided on the surface side of the semiconductor substrate and an n-type cathode layer provided on a reverse side of the semiconductor substrate, and the p-type base layer is provided in common to the wiring region and the cell region and has a lower impurity concentration and a smaller depth than the p-type well layer.

8. The semiconductor device according to claim 7, further comprising:

a p-type emitter layer provided on a surface side of the p-type base layer in the wiring region and having a higher impurity concentration than the p-type base layer; and a surface electrode connected to the p-type base layer and the p-type emitter layer, wherein the p-type emitter layer is away from the p-type well layer.

9. The semiconductor device according to claim 8, wherein the p-type emitter layer is provided in a part connected to the surface electrode.

10. The semiconductor device according to claim 7, wherein the semiconductor substrate is made of a wide-band-gap semiconductor.

11. The semiconductor device according to claim 8, wherein the semiconductor substrate is made of a wide-band-gap semiconductor.

12. The semiconductor device according to claim 9, wherein the semiconductor substrate is made of a wide-band-gap semiconductor.

* * * * *